(12) United States Patent
Hart

(10) Patent No.: US 8,351,248 B1
(45) Date of Patent: Jan. 8, 2013

(54) CMOS SRAM MEMORY CELL WITH IMPROVED N/P CURRENT RATIO

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 333 days.

(21) Appl. No.: 12/624,291

(22) Filed: Nov. 23, 2009

(51) Int. Cl.
*G11C 11/00* (2006.01)

(52) U.S. Cl. ........................................ 365/156

(58) Field of Classification Search .............. 365/156
See application file for complete search history.

(56) References Cited

U.S. PATENT DOCUMENTS

| 6,218,892 B1 * | 4/2001 | Soumyanath et al. ........ 327/537 |
| 6,775,181 B2 * | 8/2004 | Zhang et al. .................. 365/154 |
| 6,985,380 B2 | 1/2006 | Khellah et al. |

\* cited by examiner

*Primary Examiner* — Huan Hoang
*Assistant Examiner* — Pablo Huerta
(74) *Attorney, Agent, or Firm* — Scott Hewett; LeRoy D. Maunu

(57) ABSTRACT

A memory cell in an integrated circuit has a first PMOS transistor formed in N-type semiconductor material and a first NMOS transistor formed in P-type semiconductor material. A well bias line coupled to the N-type semiconductor material or to the P-type semiconductor material provides a well bias voltage not equal to the PMOS bias voltage or to the NMOS bias voltage to reverse body-bias the PMOS transistor or to forward body-bias the NMOS transistor.

20 Claims, 7 Drawing Sheets

CMOS SRAM MEMORY CELL WITH IMPROVED N/P CURRENT RATIO

FIELD OF THE INVENTION

This invention relates generally to integrated circuits, and more particularly to fabrication and operation of a CMOS random access memory.

BACKGROUND

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more function blocks connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms PLD and programmable logic device include but are not limited to these exemplary devices, as well as encompassing devices that are only partially programmable.

PLDs and other types of ICs often incorporate various types of memory, such as static random access memory (SRAM) and other types of memory. SRAM is used in a wide variety of ICs, a six-transistor CMOS cell being a common design. A six-transistor CMOS SRAM cell uses cross-coupled CMOS pairs to hold opposite binary values (commonly called Q and Q-bar), which are read by accessing the SRAM cell through access transistors controlled by a word line. The values are provided to bit lines, and read using differential techniques that are well known in the art of SRAM operation.

SRAM circuits have READ and WRITE performance margins to insure the stored data values are accurate. These READ/WRITE margins depend on several factors, such as the operating voltage of the circuit and the node technology used to design and fabricate the IC (for example, 90 nm, 65 nm, or 45 nm node technology).

At low operating voltages (e.g., $V_{CC}$<1.2V), the NMOS pull-down transistors in the CMOS pairs have a higher drain saturation current than the PMOS pull-up transistors. At small (<90 nm) technologies and low operating voltages, a ratio of $I_{Dsat}$ N/$I_{Dsat}$ P ($I_{Dsat}$ ratio) of about four to five may be required for reliable operation or even higher in some applications. That is, the saturated current through the NMOS pull-down transistors is about four to five times, and in some applications more than ten times, greater than the saturated current through the PMOS pull-up transistors.

The natural $I_{Dsat}$ ratio is not sufficient for small node technologies, and several techniques have been developed to increase the $I_{Dsat}$ ratio. One approach is to make the NMOS pull-down transistors wider (i.e., design them to have a longer gate width), which increases current; however, it also increases the size of the SRAM memory cell, which is undesirable. Another approach is to make the gate length (i.e., the dimension between the source and drain) of the PMOS pull-up transistors longer, which reduces the saturated current through the PMOS devices; however, this also increases cell area.

Although the increases to SRAM cell sizes may seem small, the cumulative effect of techniques applied to each individual SRAM cell can be quite significant.

Another approach has been to increase the threshold voltage for the PMOS pull-up transistors or otherwise weaken the PMOS transistors (e.g., by modifying the drain/source doping or channel stress), which lowers the saturated current thorough the PMOS device and hence increases the $I_{Dsat}$ ratio. These approaches typically add additional masking and processing steps, as increasing the threshold voltage of PMOS devices used elsewhere in the IC (e.g., in logic circuits) is generally undesirable.

Improving the $I_{Dsat}$ ratio of SRAM cells in memory arrays that avoid the disadvantages of the prior art are desirable.

SUMMARY

An integrated circuit (IC) includes a memory cell having a first PMOS transistor formed in N-type semiconductor material having a first PMOS source coupled to a PMOS bias terminal providing a PMOS bias voltage and a first PMOS drain coupled to a first intermediate node. A first NMOS transistor is formed in P-type semiconductor material and has a first NMOS source coupled to an NMOS bias terminal providing an NMOS bias voltage and a first NMOS drain coupled to the first intermediate node. A well bias line coupled to the N-type semiconductor material or to the P-type semiconductor material is configured so as to provide a well bias voltage not equal to the PMOS bias voltage or to the NMOS bias voltage to reverse body-bias the PMOS transistor or to forward body-bias the NMOS transistor.

In a particular embodiment, the memory cell is a static random access memory cell. In a particular embodiment, the N-type semiconductor material forms an N-well in the P-type semiconductor material. In a further embodiment, the well bias voltage is a positive voltage and the well bias line is coupled to the N-well. In a yet further embodiment, the well bias voltage is at least 0.8 V greater than the PMOS bias voltage. In an alternative embodiment, the NMOS bias voltage is ground potential, the P-type semiconductor material forms a P-well and the well bias voltage is a negative voltage provided to the P-well.

In a particular embodiment, the PMOS transistor has a first PMOS gate biased at a gate voltage producing a first saturation current at the gate voltage when the N-well is biased at the PMOS bias voltage and a second saturation current at the gate voltage when the N-well is biased at the well bias voltage, the second saturation current being at least 25% less than the first saturation current.

In a particular embodiment, the NMOS transistor has a first NMOS gate having a first NMOS gate width and the PMOS transistor has a first PMOS gate having a first PMOS gate width, the NMOS gate width being not more than three times greater than the PMOS gate width.

In a more particular embodiment, the NMOS transistor has a first NMOS gate having a first NMOS gate width and the PMOS transistor has a first PMOS gate having a first PMOS gate width, the NMOS gate width being not more than six times greater than the PMOS gate width wherein the well bias voltage is applied to the N-type semiconductor material so as to provide an NMOS saturation current for the first NMOS transistor at least five times greater than a PMOS saturation current for the first PMOS transistor.

In another embodiment, the NMOS transistor has a first NMOS gate having a first NMOS gate length and the PMOS transistor has a first PMOS gate having a first PMOS gate length, the NMOS gate length being selectively less than the PMOS gate length.

In a further embodiment, the memory cell further comprises a second PMOS transistor formed in the N-well having a second PMOS source coupled to the PMOS bias terminal and a second PMOS drain coupled to a second intermediate node, and a second NMOS transistor having a second NMOS source coupled to the NMOS bias terminal and a second NMOS drain coupled to the second intermediate node, the second intermediate node being coupled to a first PMOS gate of the first PMOS transistor and to a first NMOS gate of the first NMOS transistor and the first intermediate node being coupled to a second PMOS gate of the second PMOS transistor and to a second NMOS gate of the second NMOS transistor.

In a particular embodiment, the first NMOS transistor includes a first portion fabricated in a first P-well adjacent to the N-well and a second portion fabricated in a second P-well adjacent to the N-well, and common gate structure extending from the first P-well across the N-well to the second P-well being a common gate terminal of the first NMOS gate and the first PMOS gate.

In an alternative embodiment, a method of operating an integrated circuit having a CMOS static random access memory cell with an NMOS pull-down transistor formed in P-type semiconductor material in series with a PMOS pull-up transistor formed in an N-type semiconductor material includes applying a well bias voltage to at least one of the P-type semiconductor material and the N-type semiconductor material so as to increase a first saturation current ratio between an NMOS saturation current and a PMOS saturation current. The CMOS static random access memory cell is operated so as to WRITE a data value into the CMOS static random access memory cell while applying the well bias voltage. In a further embodiment, the well bias voltage increases the first saturation current ratio so that the NMOS saturation current is at least five times the PMOS saturation current. In a particular embodiment, the NMOS pull-down transistor has a first gate width and the PMOS pull-up transistor has a second gate width, the first gate width being not more than three times the second gate width and the well bias voltage is selected so as to provide that the NMOS saturation current is at least five times the PMOS saturation current.

In a further embodiment, the CMOS static random access memory cell is operated so as to READ the data value in the CMOS static random access memory cell while the well bias voltage is applied.

In a particular embodiment, a source terminal of the PMOS pull-up transistor is biased to a PMOS bias voltage and the well bias voltage is at least 0.8 V greater than the PMOS bias voltage and is applied to the N-type semiconductor material.

In a particular embodiment, the CMOS static random access memory cell has a second saturation current ratio when an N-well of the PMOS pull-up transistor is biased to the PMOS bias voltage and a P-well of the NMOS pull-down transistor is biased to the NMOS bias voltage, the first saturation current ratio being greater than the second saturation current ratio.

DETAILED DESCRIPTION

Figure 1:
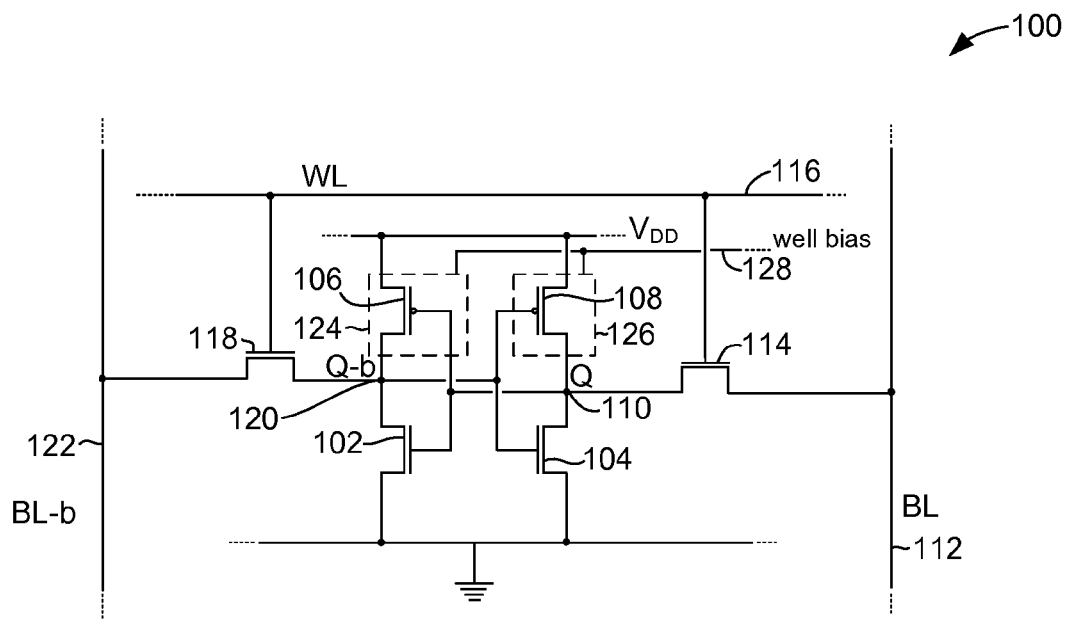
FIG. 1 is a circuit diagram of a memory cell according to an embodiment.

FIG. 1 is a circuit diagram of a memory cell 100 according to an embodiment. The memory cell includes cross-coupled CMOS pairs (inverters) that include NMOS pull-down transistors 102, 104 in series with PMOS pull-up transistors 106, 108. A first intermediate node (also known as a data node) 110 between transistors 104, 108 is coupled to, or decoupled from, a bit line 112 through an address transistor 114, which is controlled by a word line 116. The word line 116 also controls a second address transistor 118, which couples or decouples a second intermediate node 120 from a second bit line 122. The source of the PMOS pull-up transistor 108 is coupled to the PMOS bias terminal (e.g., $V_{DD}$) and the drain of the PMOS pull-up transistor is coupled to the intermediate (data) node 110, as is the drain of the NMOS pull-down transistor 104. The source of the NMOS pull-down transistor 104 is coupled to $V_{SS}$, which in this example is ground.

The NMOS and PMOS transistors 102, 106 form a first inverter and the NMOS and PMOS transistors 104, 108 form a second inverter that is cross-coupled with the first inverter. The data nodes 110, 120 store opposite binary data (logic) values (commonly referred to as Q and Q-bar), which are coupled to the gates of the opposite CMOS pair (inverter). The data value stored on the intermediate node 110 controls the state of the PMOS and NMOS FETs in the cross-coupled inverter (i.e., transistors 102 and 106). Cross-coupling the inverters provides a static memory cell that can be accessed for a READ operation or a WRITE operation through operation of the bit lines and word line, i.e., an SRAM cell. Since the data values are opposite (i.e., one data value is a HI data value, while the other is a LO data value), one of the PMOS transistors will be turned ON, pulling up the data node, while in the other inverter the NMOS transistor will be turned ON, pulling the other data node down.

The $I_{Dsat}$ ratio of the memory cell 100 is increased by reverse body-biasing the N-wells 124, 126 of the PMOS pull-up transistors 106, 108. The N-wells are portions of N-type semiconductor formed in P-type semiconductor, such as in P-type bulk silicon or P-type epitaxial silicon. The PMOS transistors are formed in the N-type semiconductor material, i.e., the channel region of a PMOS transistor is N-type semiconductor material. Similar terminology is used for the NMOS transistors, which are formed in P-type semiconductor material, such as P-type bulk silicon, P-type epitaxial silicon, or a P-well (see, e.g., FIGS. 2B, 2C).

The well bias is provided on a well bias line 128 that provides a well bias voltage greater than the PMOS supply voltage $V_{DD}$. The well bias is applied from an external or internally derived voltage supply(s). For example, a well bias voltage of about 1.8 V, which is a common supply voltage level in SRAM devices, is provided to the N-wells 124, 126 for a PMOS bias voltage $V_{DD}$ of about 1.0 V supplied to the PMOS pull-up transistors 106, 108. This creates a reverse body-bias (i.e., raises the N-well voltage above the PMOS transistor source bias voltage $V_{DD}$) of about 0.8 V on the PMOS transistors. Simulations show that in a 40 nm node technology this amount of reverse body-bias will reduce PMOS $I_{Dsat}$ by about 25%, increasing the effective $I_{Dsat}$ ratio by 33%. In conventional SRAM CMOS memory cells, the N-wells are coupled to $V_{DD}$ which forms reversed-bias junctions between the N-wells and P-type epitaxial or bulk semiconductor material.

The reduction of PMOS $I_{Dsat}$ allows design of a small SRAM cell with improved READ/WRITE performance. In some embodiments, a reduction in cell area of between about 6% and 11% are expected using reverse body-bias techniques according to embodiments compared to conventional cells using greater NMOS gate width to achieve a higher $I_{Dsat}$ ratio. While an additional bias line provides the well bias, this is accommodated in the overlying metallization layers, and does not consume significant silicon area. Furthermore, a single N-well tap is often sufficient for several PMOS devices (e.g., PMOS devices that are fabricated in a common N-well, see, e.g., FIG. 5), with N-taps occurring every 16, 32, or 64 SRAM cells, for example. The N-well taps & associated metal lines are required in conventional SRAM arrays, so the only area penalty for applying reverse body-bias to the PMOS devices would be any additional metal connections required at the array periphery. Thus, any additional area for the N-well taps and strapping will be very small relative to the reduction in cell area achieved using embodiments to reverse body-bias PMOS pull-up transistors or to forward body-bias NMOS pull-down transistors.

Figure 2:
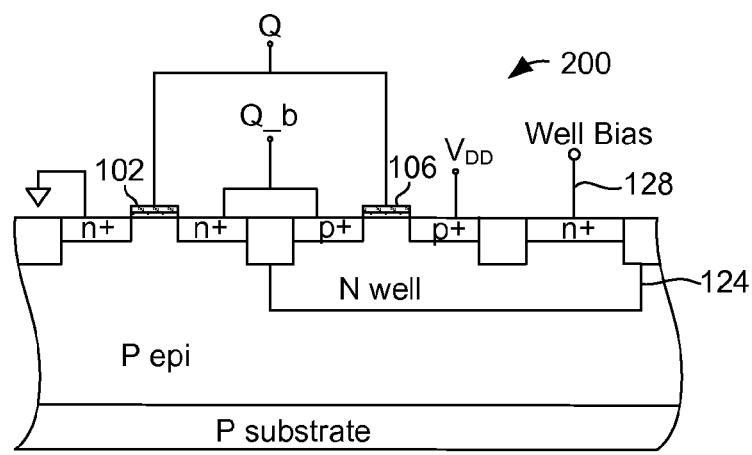
FIG. 2 is a cross section of a portion of a memory cell using N-well bias according to an embodiment.

FIG. 2 is a cross section of a portion of a memory cell 200 using N-well bias according to an embodiment. The PMOS pull-up transistor 106 is fabricated in N-well 124, which is biased with well bias line 128 (compare, FIG. 1) thorough a well bias tap. Those familiar with well bias taps and related techniques will appreciate that the connection of the well bias line 128 to the N-well 124 is stylized for purposes of illustration.

The gates of the PMOS pull-up transistor 106 and NMOS pull-down transistor 102 are coupled to intermediate node 120, which holds data value Q-bar, and the intermediate node 110 between the PMOS and NMOS transistors 102, 106 holds data value Q. This keeps one of the transistors ON and the other OFF, depending on the assigned values of Q and Q-bar. The PMOS transistor 106 is coupled in series with the NMOS transistor (through node Q_b) between the PMOS bias voltage ($V_{DD}$) and ground.

Figure 3:
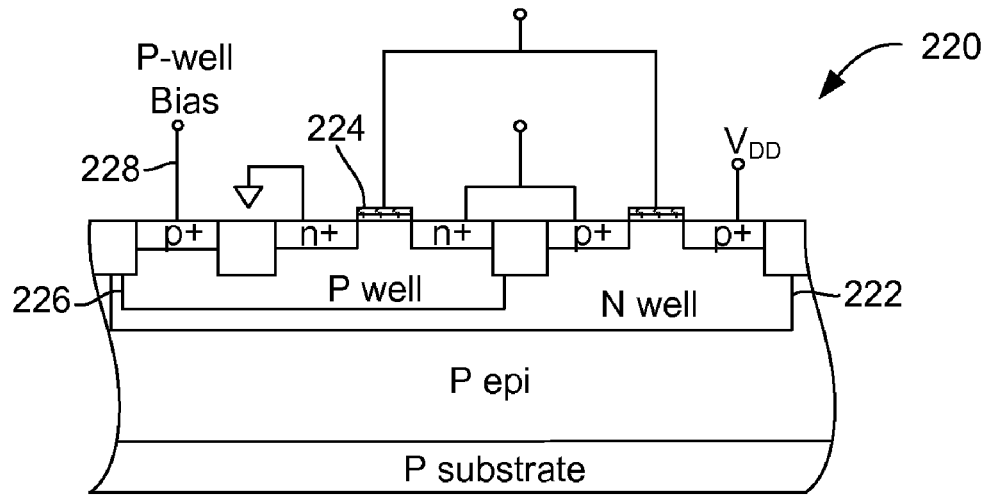
FIG. 3 is a cross section of a portion of a memory cell using P-well bias according to an embodiment.

FIG. 3 is a cross section of a portion of a memory cell 220 using P-well bias according to an embodiment. The N-well 222 extends below the NMOS device 224, which is formed in a P-well 226 formed in the N-well 222. P-well bias is applied on a well bias line 228, which creates a forward-bias in the NMOS device 224, reducing the threshold voltage of the NMOS device and increasing its $I_{Dsat}$. In a particular embodiment, the P-well is coupled to a voltage supply of about 0.2 V to about 0.5 V.

Figure 4:
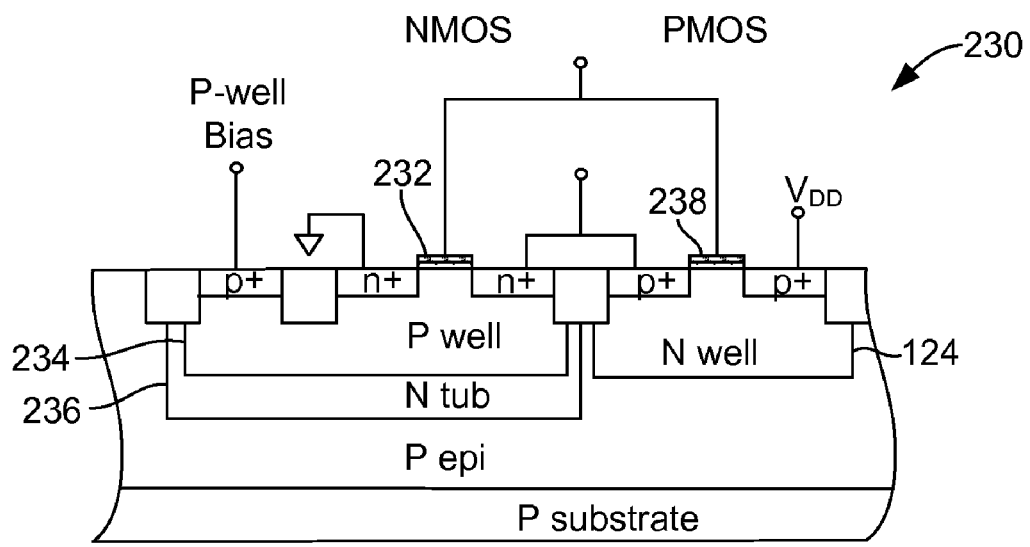
FIG. 4 is a cross section of a portion of a memory cell using P-well bias according to a triple-well embodiment.

FIG. 4 is a cross section of a portion of a memory cell 230 using P-well bias according to a triple-well embodiment. The NMOS pull-down transistor 232 is formed in a P-well 234, which is formed in a deep N-well 236, also called an N-tub. The combination of a P-well in a deep N-well and a separate N-well for the PMOS device 238 is commonly referred to as triple-well technology. Other types of triple-well technology are alternatively used. Triple-well technology isolates each well because P-N junctions are formed around the wells, which is particularly desirable for noise isolation and for use in high-frequency circuits. The P-well bias voltage creates a forward body-bias in the NMOS device, as described above in reference to FIG. 3, to improve the $I_{Dsat}$ ratio.

Figure 5:
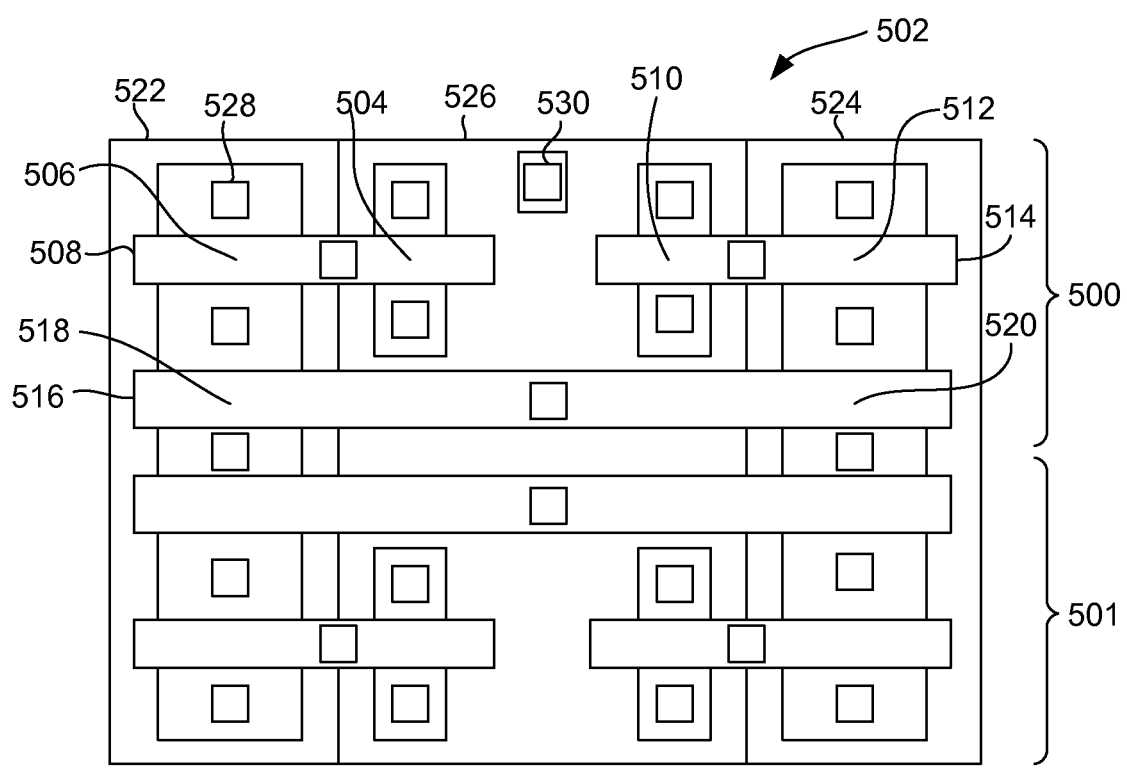
FIG. 5 is a plan view of an SRAM cell according to an embodiment.

FIG. 5 is a plan view of an SRAM cell 500 according to an embodiment. The SRAM cell 500 is in an SRAM array 502 of an IC that includes a second SRAM cell 501. The second SRAM cell 501 is basically a mirror image of the first SRAM cell 500. The SRAM cell 500 can be understood with reference to FIG. 1. PMOS transistor 504 and NMOS transistor 506 are controlled by a gate structure 508 (compare, FIG. 1, PMOS transistor 106, NMOS transistor 102, and common gate terminal Q 110). Similarly, PMOS transistor 510 and NMOS transistor 512 are controlled by gate structure 514. Another gate structure 516 controls NMOS pass transistors 518, 520 (compare, FIG. 1, NMOS transistors 114, 118).

The NMOS transistors are fabricated in P-wells 522, 524, and the PMOS transistors are fabricated in N-well 526. Contacts are represented by squares. For example, contact 528 is coupled to ground, and contact 530 is coupled to well bias for the N-well (compare, FIG. 1, ref. num. 128). FIG. 5 is not drawn to scale and is merely exemplary. Embodiments include non-straight gate structures to accommodate layout rules and provide for a compact cell. In a particular embodiment, the cell height (e.g., basically the dimension indicated by the bracket 500) is about 0.46 microns. The NMOS pull-down device 506 has a gate width about 1.64 times the gate width of the PMOS pull-up device 504, and the gate length of the PMOS pull-up device 504 is about 1.36 times the gate length of the NMOS pull-down device 506. This provides an N/P $I_{Dsat}$ ratio of about 5. The $I_{Dsat}$ ratio is enhanced by applying reverse body bias to the N-well 526.

Figure 6:
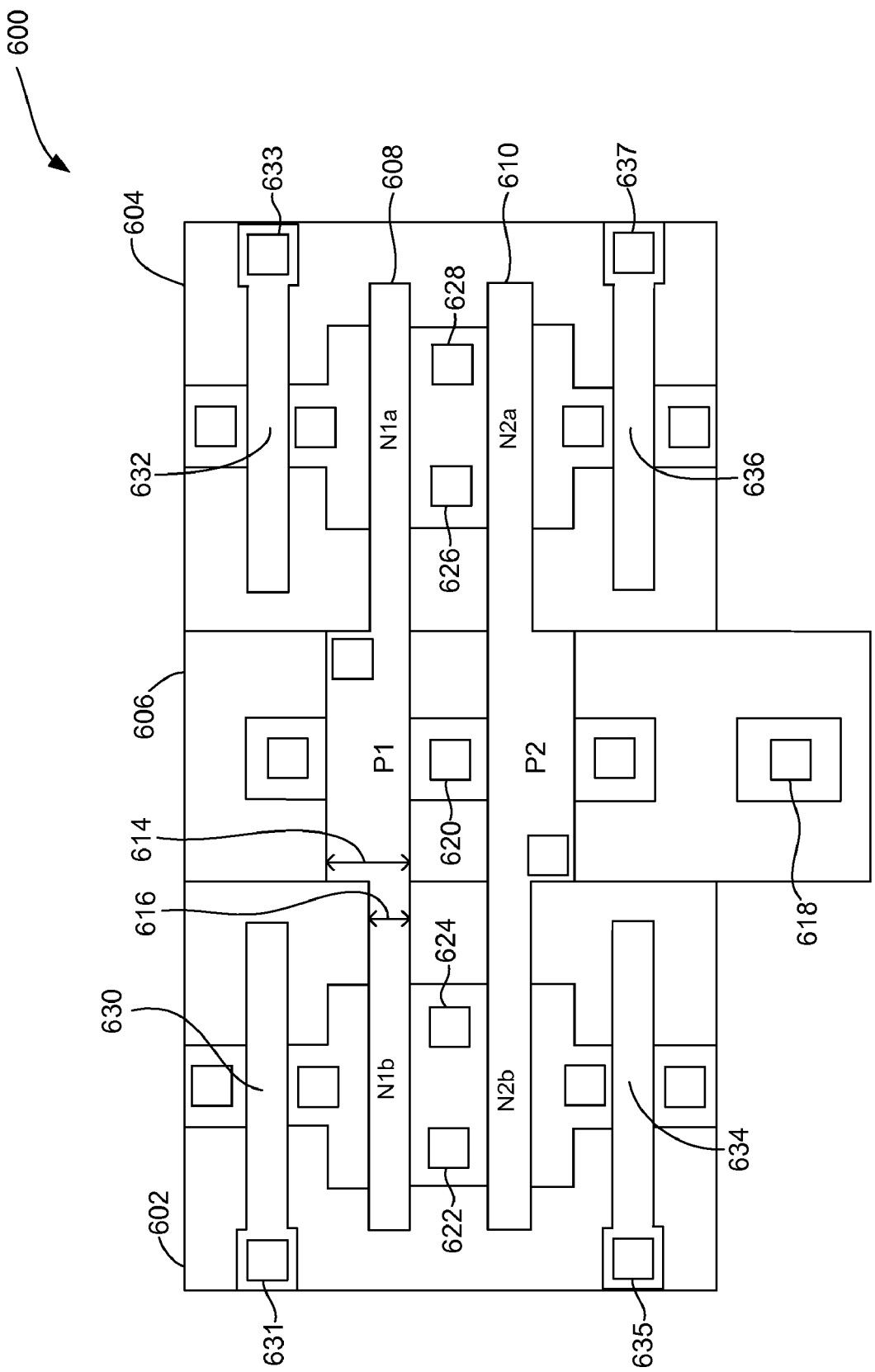
FIG. 6 is a plan view of an SRAM cell according to another embodiment.

FIG. 6 is a plan view of an SRAM cell 600 according to another embodiment. The SRAM memory cell 600 is slightly different from the circuit diagram of FIG. 1 in that the memory cell is what is commonly known as a dual port memory cell, which provides ability to read & write multiple cells in the array simultaneously. The SRAM memory cell has two P-wells 602, 604, which form the NMOS portion of the cell, and an N-well 606, which forms the PMOS portion of the cell. A common gate structure 608 extends across the NMOS and PMOS active regions and is the common gate of a CMOS inverter. A second common gate structure 610 forms the gates of the other CMOS inverter in the memory cell.

The common gate structure 608 controls the PMOS FET P1 and the NMOS FETs N1a and N1b, which operate essentially as a single NMOS FET in the memory cell 600 (i.e., as NMOS FET 101 in FIG. 1). Fabricating these FETs on either side of the PMOS region increases the gate width (basically, the width of the active area that the gate structure crosses), which increases saturation current drawn by the NMOS FET (relative to the PMOS FET P1). A contact 612 provides an electrical connection to the common gate structure 608. Other contacts provide electrical connections to device terminals, and will be familiar to those of skill in the art of CMOS fabrication.

The gate length 614 of the PMOS FET P1 is greater than the gate length 616 of the corresponding NMOS FET(s), which decreases the saturation current drawn by the PMOS FET P1 relative to the saturation current drawn by the combination of N1a and N1b. A well contact 618 (N-tap) is biased with a voltage ($V_{WELL}$) greater than the PMOS voltage supply (e.g., $V_{DD}$ or $V_{CC}$), which is applied to contact 620. Contacts 622, 624, 626, 628 provide bias (e.g., $V_{SS}$, which in a particular embodiment is ground potential) to the sources of the NMOS FETs. Address transistors 630, 632, 634, 636 couple data values to bit lines (not shown) and are controlled by word lines (not shown) coupled to their gate terminals 631, 633, 635, 637.

Figure 7:
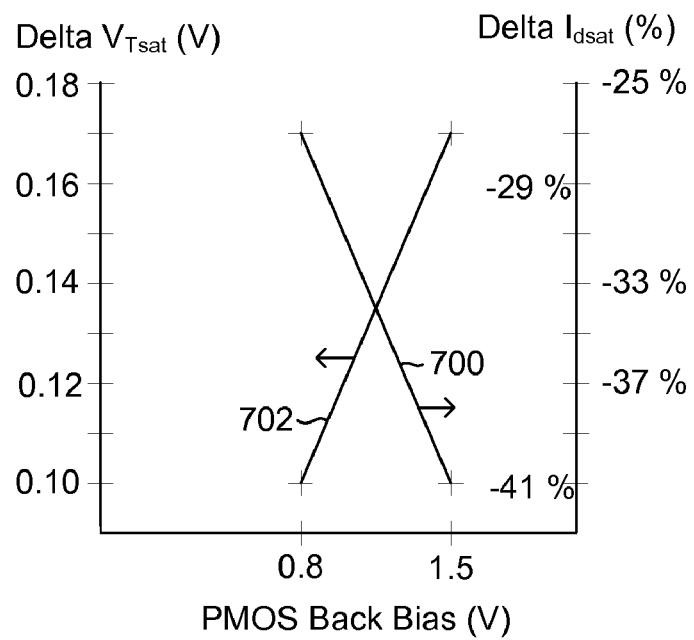
FIG. 7 is a plot showing saturation current versus change in threshold voltage with applied reverse body-bias voltage.

FIG. 7 shows a plot 700 of simulated saturation current and a plot of threshold voltage change (Delta $V_{Tsat}$) 702 versus applied reverse body-bias voltage. The plots are modeled on a PMOS transistor having a gate width of 0.5 microns and a gate length of 0.04 microns in a 40 nm node technology process. $Vt_{SAT}$ and $I_{Dsat}$ were modeled at a reverse body-bias of 0.8 V ($V_{Nwell}$=1.8 V) and at a reverse body-bias of 1.5 V ($V_{Nwell}$=2.5 V). This model predicts an increase in Vt of over 100 mV and a reduction in IDSAT of greater than 25% at a reverse body-bias of 0.8 V compared to a similar device with the N-well biased to the transistor supply, e.g., 1.0 V. This increases the N/P ratio by about 35% at a reverse body-bias of 0.8 V.

Figure 8:
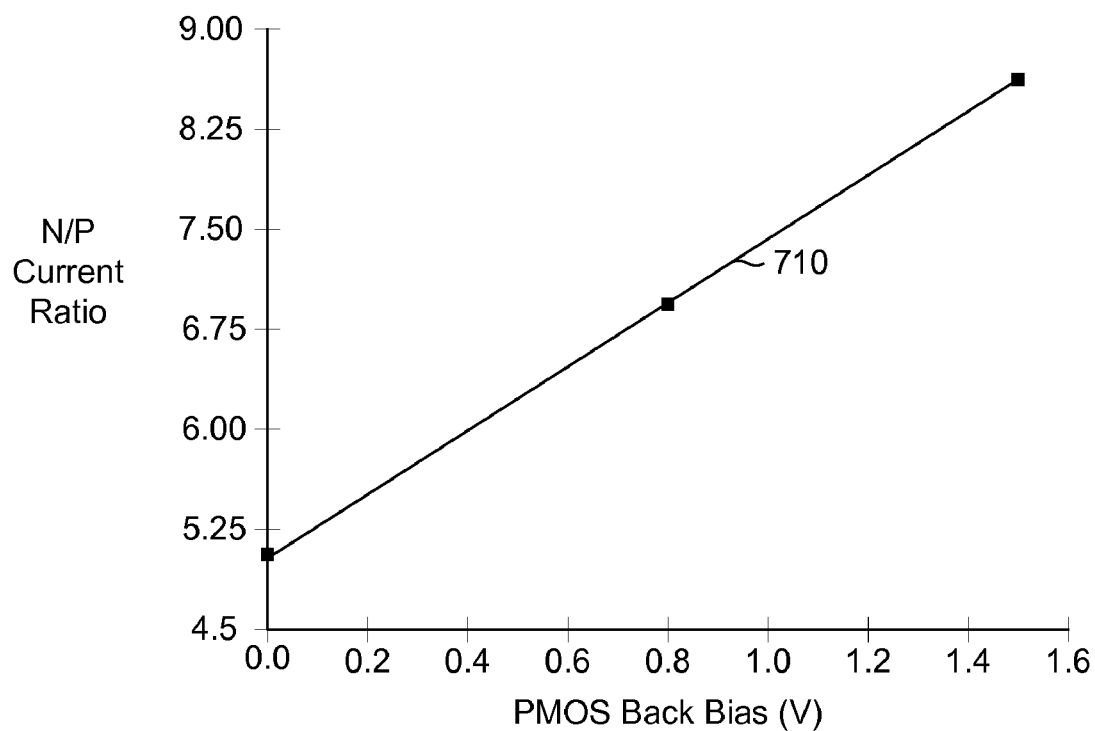
FIG. 8 is a plot showing N/P $I_{Dsat}$ ratio versus reverse body-bias voltage according to an embodiment.

FIG. 8 is a plot 710 showing $I_{Dsat}$ ratio (N/P ratio) verses reverse body-bias voltage according to an embodiment in which the NMOS gate width was about two times greater than the PMOS gate width (see, e.g., FIG. 5). The pull-down NMOS width is about 0.18 microns and the pull-up PMOS width is about 0.11 microns, which gives a ratio of about 5:1 for the total N/P $I_{Dsat}$ ratio. These modeled results are for a CMOS memory cell defined in a 40 nm node technology process. At a reverse body-bias of 0.8 V (applied to the N-well of the PMOS pull-up transistors in the CMOS memory cell), the N/P ratio 412 increases about 35% from the N/P ratio at zero reverse body-bias 414 (i.e., N-well at Vdd). At a reverse body-bias of 1.5 V, the N/P current ratio increases about 65%.

In some embodiments, an N/P current ratio of greater than 10 is achieved while maintaining low SRAM cell area.

In an embodiment having a 25% reduction in $I_{Dsat}$ from the PMOS pull-up devices in a CMOS memory cell, the width of the associated NMOS pull-down devices can be reduced from about 0.18 um to about 0.135 um (shown in FIG. 5). This provides a reduction in the CMOS memory cell area (silicon area) of about 6%, which is very desirable as it provides substantial silicon area savings in ICs with large numbers of CMOS memory cells (e.g., ICs with CMOS memory arrays). In another embodiment (see, e.g., FIG. 6), the width of the NMOS pull-down transistors is reduced from about 0.62 microns to about 0.46 microns, which allows a reduction in the memory cell area of about 11%. Various embodiments may be included on the same IC to achieve improved performance or reduced area.

Figure 9:
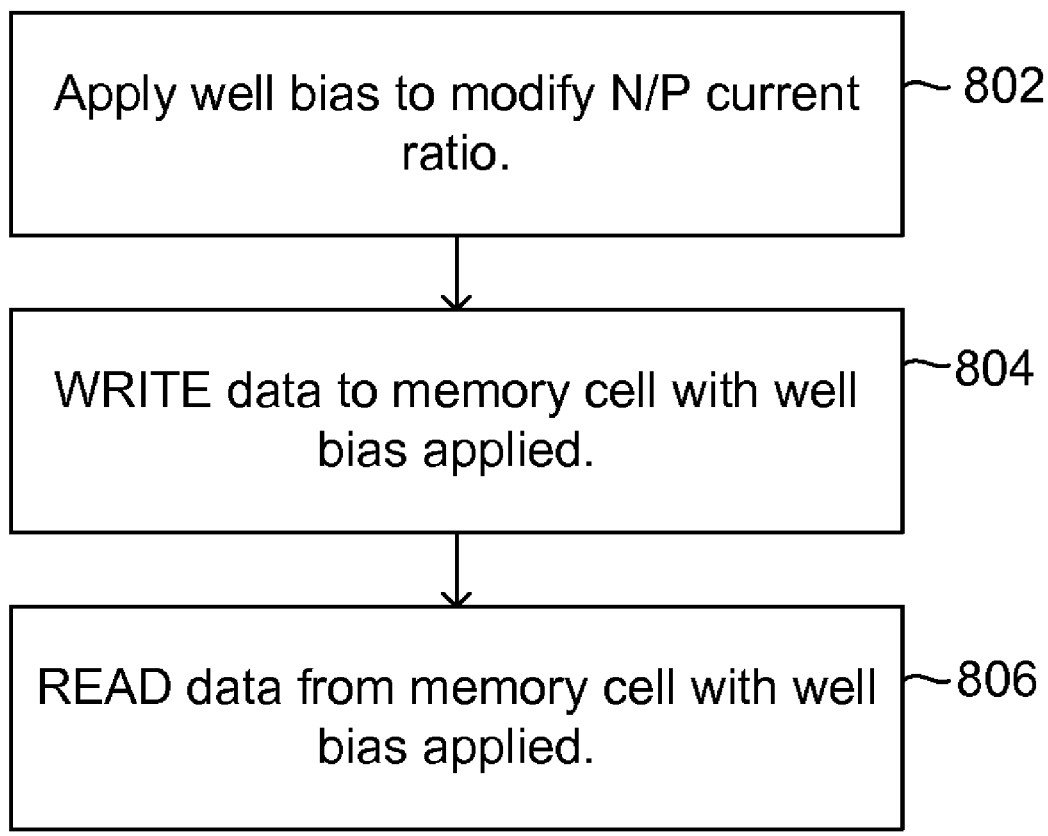
FIG. 9 is a flow chart of a method of operating an integrated circuit according to an invention.

FIG. 9 is a flow chart of a method of operating an integrated circuit 800 according to an invention. The integrated circuit includes a CMOS memory cell with two NMOS pull-down transistors and two PMOS pull-up transistors. Well bias is applied to at least the N-wells of the PMOS pull-up transistors and the P-wells of the NMOS pull-down transistors to modify the N/P current ratio (step 802). In a particular embodiment, well bias is applied to the N-wells to reverse body-bias the PMOS pull-up transistors. In a further embodiment, the reverse body-bias is between about 0.8 V and about 1.5 V. In a yet further embodiment, the transistor supply voltage is about 1.0 V, and the N-well bias is between about 1.8 V and about 2.5 V. In an alternative embodiment, the NMOS pull-down transistors are fabricated in one or more P-wells, and the P-wells are biased to forward body-bias the NMOS pull-down devices. In a particular embodiment, the P-wells are forward body-biased at a well voltage of between about 0.5 V to about 1.0 V. In yet another embodiment, the N-wells are biased so as to reverse body-bias the PMOS pull-up transistors, and the P-wells are biased so as to forward body-bias the NMOS pull-down transistors. The CMOS memory cell is operated so as to WRITE a data value into the CMOS memory cell (step 804) and optionally the data value is READ from the CMOS memory cell (step 806). The well bias may not be required during a READ operation; as it is typically the WRITE operation that most benefits from a high N/P $I_{DSat}$ ratio. In a particular embodiment, the N/P $I_{Dsat}$ ratio for the well-biased CMOS memory cell is greater than 5. In a further embodiment, the CMOS memory cell is fabricated in a node technology less than or equal to a 40 nm node technology and has an N/P gate width ratio not greater than three in one embodiment, and up to six in a high-performance embodiment. Other embodiments, such as high-speed dual port cell, have even higher N/P gate width ratios. The combination of a high N/P $I_{Dsat}$ ratio>5 and an N/P gate width ratio not greater than three is particularly desirable in an IC in an node technology 40 nm or smaller to allow for smallest cell area and ease of writing/reading the SRAM cell at low Vcc.

Figure 10:
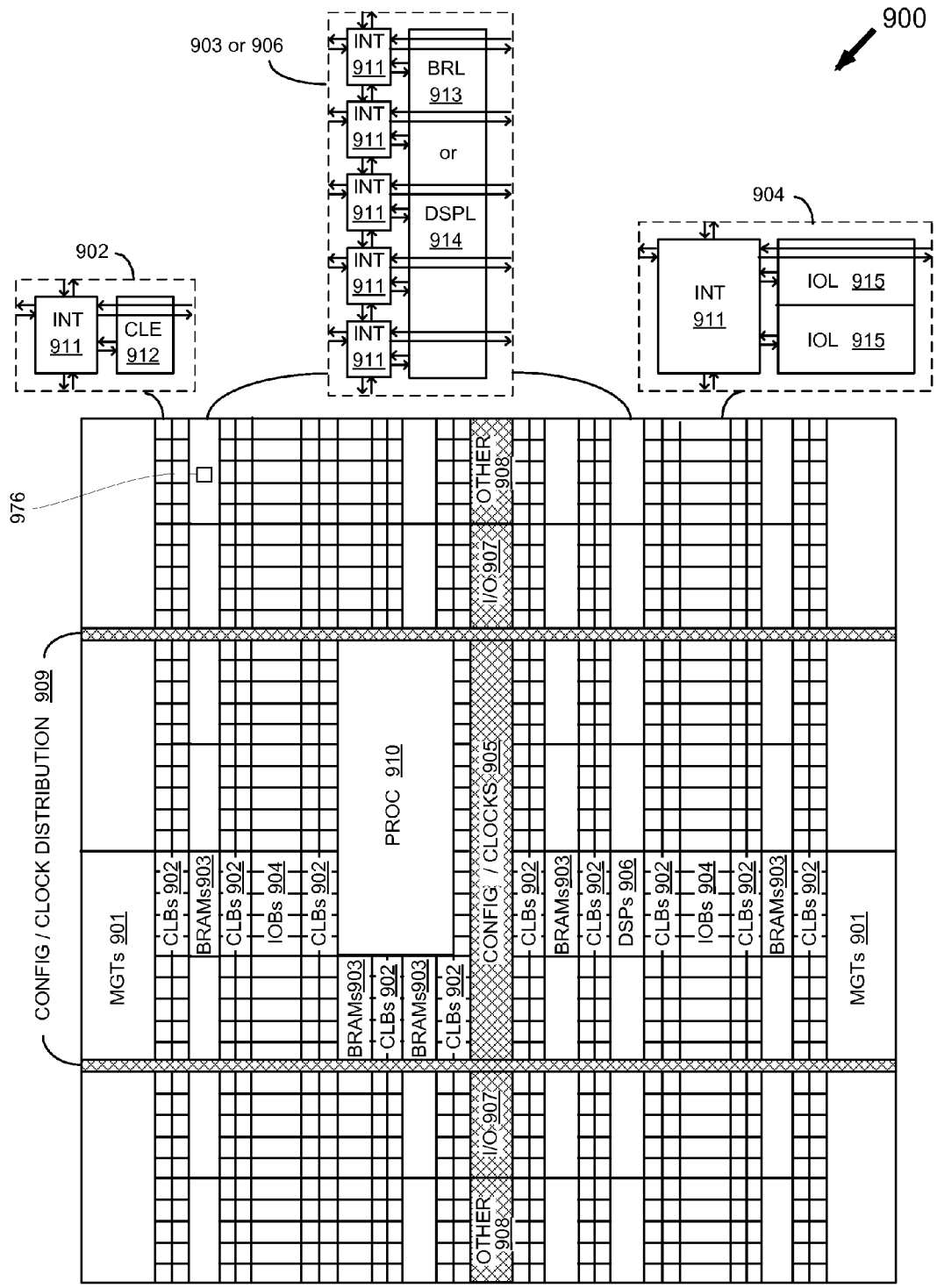
FIG. 10 is a plan view of an IC including a memory array according to an embodiment.

FIG. 10 is a plan view of an IC 900 including one or more memory cells according to one or more embodiments. The IC 900 is an FPGA, but is alternatively a different type of IC, such as graphics processor, microprocessor, logic device or other IC incorporating SRAM. The FPGA is fabricated using a CMOS fabrication process or mixed CMOS/NMOS process and incorporates one or more memory cells according to one or more embodiments of the invention. For example, a memory cell 976 according to an embodiment is incorporated into a block of RAM 903. A single IC may have many memory cells according to an embodiment or different memory cells according to different embodiments. For example, a first memory array or portion of a memory array may have many memory cells according to a first embodiment, and a second memory array or second portion may have many memory cells according to a second embodiment Embodiments are particularly desirable in application where it is desirable to reduce the area of SRAM cells or to improve the WRITE/READ margin or speed.

The FPGA architecture includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic 908 such as digital clock managers, analog-to-digital converters, system monitoring logic, and so forth. Some FPGAs also include dedicated processor blocks (PROC 910).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 9.

For example, a CLB 902 can include a configurable logic element (CLE 912) that can be programmed to implement user logic plus a single programmable interconnect element (INT 911). A BRAM 903 can include a BRAM logic element (BRL 913) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element (INT 911). A differential I/O buffer 918 is also part of IOB 904. As will be clear to those of skill in the art, the actual I/O pads connected, for example, to the differential I/O buffer 918 are manufactured using metal layers above the various illustrated logic blocks, and typically are not confined to the area of the input/output differential I/O buffer 918. In the pictured embodiment, a columnar area near the center of the die is used for configuration, clock, and other control logic.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of memory cells or memory arrays, alternative well bias techniques, and various node technologies could be alternatively used. Similarly, embodiments may bias the P-well of a CMOS SRAM cell, the N-well of a CMOS SRAM cell, or both the P-well and the N-well, and different well-bias techniques according to embodiments may be used in different areas of an IC device. Therefore, the spirit and scope of the appended claims should not be limited to the foregoing description.

What is claimed is:

1. An integrated circuit (IC), comprising:
a memory cell having
 a first PMOS transistor formed in N-type semiconductor material having a first PMOS source coupled to a PMOS bias terminal providing a PMOS bias voltage and a first PMOS drain coupled to a first intermediate node;
 a first NMOS transistor formed in P-type semiconductor material having a first NMOS source coupled to an NMOS bias terminal providing an NMOS bias voltage and a first NMOS drain coupled to the first intermediate node; and
wherein the N-type semiconductor material forms an N-well in the P-type semiconductor material;
a well bias line coupled to the N-type semiconductor material or to the P-type semiconductor material, wherein the well bias line:
 couples a well bias voltage that is greater than the PMOS bias voltage so as to reverse body-bias the PMOS transistor while a data value is read from the memory cell; or
 couples a well bias voltage so as to forward body-bias the NMOS transistor;
wherein the well bias voltage is a positive voltage and the well bias line is coupled to the N-well;
wherein the first PMOS transistor comprises:
 a first PMOS gate biased at a gate voltage producing a first saturation current at the gate voltage when the N-well is biased at the PMOS bias voltage; and
 a second saturation current at the gate voltage when the N-well is biased at the well bias voltage,
 wherein the second saturation current is at least 25% less than the first saturation current.

2. The IC of claim 1, wherein the memory cell comprises a static random access memory cell.

3. The IC of claim 1, wherein the well bias voltage is at least 0.8 V greater than the PMOS bias voltage.

4. The IC of claim 1, wherein:
the NMOS transistor comprises a first NMOS gate having a first NMOS gate width;
the PMOS transistor comprises a first PMOS gate having a first PMOS gate width; and
the NMOS gate width is not more than three times greater than the PMOS gate width.

5. The IC of claim 1, wherein:
the NMOS transistor comprises a first NMOS gate having a first NMOS gate width;
the PMOS transistor comprises a first PMOS gate having a first PMOS gate width;
the NMOS gate width is not more than three times greater than the PMOS gate width; and
the well bias voltage is applied to the N-type semiconductor material so as to provide an NMOS saturation current for the first NMOS transistor at least five times greater than a PMOS saturation current for the first PMOS transistor.

6. The IC of claim 1, wherein:
the NMOS transistor comprises a first NMOS gate having a first NMOS gate length;
the PMOS transistor comprises a first PMOS gate having a first PMOS gate length; and
the NMOS gate length is selectively less than the PMOS gate length.

7. The IC of claim 1, wherein the memory cell further comprises:
a second PMOS transistor formed in the N-well having a second PMOS source coupled to the PMOS bias terminal and a second PMOS drain coupled to a second intermediate node; and
a second NMOS transistor having a second NMOS source coupled to the NMOS bias terminal and a second NMOS drain coupled to the second intermediate node,
wherein the second intermediate node is coupled to a first PMOS gate of the first PMOS transistor and to a first NMOS gate of the first NMOS transistor; and
wherein the first intermediate node is coupled to a second PMOS gate of the second PMOS transistor and to a second NMOS gate of the second NMOS transistor.

8. The IC of claim 7, wherein the first NMOS transistor includes:
a first portion fabricated in a first P-well adjacent to the N-well; and
a second portion fabricated in a second P-well adjacent to the N-well;
wherein a common gate structure extending from the first P-well across the N-well to the second P-well comprises a common gate terminal of the first NMOS gate and the first PMOS gate.

9. The IC of claim 1, wherein the NMOS bias voltage is a ground potential.

10. The IC of claim 1, wherein the P-type semiconductor material forms a P-well.

11. The IC of claim 10, wherein the well bias voltage is a positive voltage provided to the P-well.

12. A memory cell, comprising:
a first inverter cross-coupled to a second inverter;
wherein the first inverter includes a first NMOS transistor coupled in series to a first PMOS transistor, and the second inverter includes a second NMOS transistor coupled in series to a second PMOS transistor, and the first and second PMOS transistors are disposed in respective N-wells;
wherein gates of the first PMOS transistor and the first NMOS transistor are connected to a node between the second PMOS transistor and the second NMOS transistor, and gates of the second PMOS transistor and the second NMOS transistor are connected to a node between the first PMOS transistor and the first NMOS transistor;
a PMOS supply voltage line coupled to source nodes of the first and second PMOS transistors and configured and arranged to provide a PMOS supply voltage to the first and second PMOS transistors; and
a well bias line coupled to the respective N-wells and configured and arranged to provide, while a data value is read from the memory cell, a well bias voltage to the N-wells, wherein the well bias voltage is greater than the PMOS supply voltage and creates a reverse body bias on the PMOS transistors.

13. An integrated circuit (IC), comprising:
a memory cell having
a first PMOS transistor formed in N-type semiconductor material having a first PMOS source coupled to a PMOS bias terminal providing a PMOS bias voltage and a first PMOS drain coupled to a first intermediate node;
a first NMOS transistor formed in P-type semiconductor material having a first NMOS source coupled to an NMOS bias terminal providing an NMOS bias voltage and a first NMOS drain coupled to the first intermediate node; and
a well bias line coupled to the N-type semiconductor material, wherein the well bias line couples a well bias voltage that is greater than the PMOS bias voltage so as to reverse body-bias the PMOS transistor while a data value is read from the memory cell.

14. The IC of claim 13, wherein the memory cell comprises a static random access memory cell.

15. The IC of claim 13, wherein the N-type semiconductor material forms an N-well in the P-type semiconductor material.

16. The IC of claim 15, wherein the well bias voltage is a positive voltage and the well bias line is coupled to the N-well.

17. The IC of claim 16, wherein the well bias voltage is at least 0.8 V greater than the PMOS bias voltage.

18. The IC of claim 16, wherein the memory cell further comprises:
a second PMOS transistor formed in the N-well having a second PMOS source coupled to the PMOS bias terminal and a second PMOS drain coupled to a second intermediate node; and
a second NMOS transistor having a second NMOS source coupled to the NMOS bias terminal and a second NMOS drain coupled to the second intermediate node,
wherein the second intermediate node is coupled to a first PMOS gate of the first PMOS transistor and to a first NMOS gate of the first NMOS transistor; and
wherein the first intermediate node is coupled to a second PMOS gate of the second PMOS transistor and to a second NMOS gate of the second NMOS transistor.

19. The IC of claim 13, wherein:
the NMOS transistor comprises a first NMOS gate having a first NMOS gate width;
the first PMOS transistor comprises a first PMOS gate having a first PMOS gate width; and
the first NMOS gate width is not more than three times greater than the first PMOS gate width.

20. The IC of claim 13, wherein:
the first NMOS transistor comprises a first NMOS gate having a first NMOS gate width;
the first PMOS transistor comprises a first PMOS gate having a first PMOS gate width;
the first NMOS gate width is not more than three times greater than the first PMOS gate width; and
the well bias voltage is applied to the N-type semiconductor material so as to provide an NMOS saturation current for the first NMOS transistor at least five times greater than a PMOS saturation current for the first PMOS transistor.

* * * * *